(12) United States Patent
Chen et al.

(10) Patent No.: US 10,658,606 B2
(45) Date of Patent: May 19, 2020

(54) QUANTUM DOT LIGHT EMITTING DEVICE, METHOD OF MANUFACTURING THE SAME, AND QUANTUM DOT LIGHT EMITTING DISPLAY DEVICE

(71) Applicant: BOE TECHNOLOGY GROUP CO., LTD., Beijing (CN)

(72) Inventors: Zhuo Chen, Beijing (CN); YuJu Chen, Beijing (CN); Dong Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/168,239

(22) Filed: Oct. 23, 2018

(65) Prior Publication Data

US 2019/0288225 A1 Sep. 19, 2019

(30) Foreign Application Priority Data

Mar. 19, 2018 (CN) .......................... 2018 1 0223369

(51) Int. Cl.
   *H01L 51/50* (2006.01)
   *H01L 51/56* (2006.01)
(52) U.S. Cl.
   CPC ........ *H01L 51/502* (2013.01); *H01L 51/5064* (2013.01); *H01L 51/5072* (2013.01); *H01L 51/56* (2013.01)
(58) Field of Classification Search
   CPC ... H01L 51/502; H01L 51/56; H01L 51/5072; H01L 51/5064; H01L 51/5096
   See application file for complete search history.

(56) References Cited

U.S. PATENT DOCUMENTS

2016/0240730 A1* 8/2016 Murayama ............ H01L 51/502

FOREIGN PATENT DOCUMENTS

| CN | 105655495 A | 6/2016 |
| CN | 105762305 A | 7/2016 |
| CN | 106654027 A | 5/2017 |

(Continued)

OTHER PUBLICATIONS

Chinese Office Action dated Jun. 28, 2019, from application No. 201810223369.7.

(Continued)

*Primary Examiner* — Anthony Ho
(74) *Attorney, Agent, or Firm* — Foley & Lardner LLP

(57) ABSTRACT

A quantum dot light emitting device is disclosed. The quantum dot light emitting device includes a first electrode and a second electrode. The quantum dot light emitting device includes a quantum dot light emitting layer interposed between the first electrode and the second electrode. The quantum dot light emitting device includes a first hole transport layer located between the quantum dot light emitting layer and the first electrode. The quantum dot light emitting device includes a hole injection layer located between the first hole transport layer and the first electrode. The quantum dot light emitting device includes an electron transport layer located between the quantum dot light emitting layer and the second electrode. The quantum dot light emitting device includes a filling layer located between the electron transport layer and the quantum dot light emitting layer and embedded in the quantum dot light emitting layer.

19 Claims, 3 Drawing Sheets

(56) References Cited

FOREIGN PATENT DOCUMENTS

| CN | 106816545 A | 6/2017 |
| CN | 106848085 A | 6/2017 |
| CN | 107833976 A | 3/2018 |

OTHER PUBLICATIONS

Chinese Office Action dated Nov. 26, 2019, from application No. 201810223369.7.

* cited by examiner

QUANTUM DOT LIGHT EMITTING DEVICE, METHOD OF MANUFACTURING THE SAME, AND QUANTUM DOT LIGHT EMITTING DISPLAY DEVICE

CROSS REFERENCE

The present application is based upon and claims priority to Chinese Patent Application No. 201810223369.7, filed on Mar. 19, 2018, and the entire contents thereof are incorporated herein by reference.

TECHNICAL FIELD

The present disclosure relates to the technical field of display technology, and in particular, to a quantum dot light emitting device, a method for manufacturing the same, and a quantum dot light emitting display device.

BACKGROUND

With the deep development of the quantum dot technology, the stability of quantum dots and the luminous efficiency are increasing, and the application prospects of quantum dot light emitting diode (QLED) in the display field are also becoming brighter. Efficient QLED devices use $TiO_2$ nanoparticles or ZnO nanoparticles as the electron transport layer, which can result in the QLED's external quantum efficiency (EQE) of more than 10%.

It should be noted that the information in the Background section disclosed above is only for enhancing the understanding of the background of the present disclosure, and thus may include information that does not constitute prior art known to those of ordinary skill in the art.

SUMMARY

Some arrangements of the present disclosure provide a quantum dot light emitting device, a method of manufacturing the same, and a quantum dot light emitting display device.

According to an aspect of the present disclosure, there is provided a quantum dot light emitting device includes a first electrode and a second electrode. The quantum dot light emitting device a quantum dot light emitting layer interposed between the first electrode and the second electrode. The quantum dot light emitting device includes a filling layer located on the quantum dot light emitting layer and embedded in the quantum dot light emitting layer.

In some arrangements of the present disclosure, the filling layer has a first surface adjacent to the first electrode and a second surface adjacent to the second electrode. The quantum dot light emitting layer is interposed between the first surface and the second surface. The distance between the quantum dot light emitting layer and the first surface is less than the distance between the quantum dot light emitting layer and the second surface.

In some arrangements of the present disclosure, the quantum dot light emitting layer is in contact with the first surface.

In some arrangements of the present disclosure, the first electrode is an anode and the second electrode is a cathode.

In some arrangements of the present disclosure, the quantum dot light emitting device further includes a first hole transport layer interposed between the quantum dot light emitting layer and the first electrode.

In some arrangements of the present disclosure, the filling layer includes a second hole transport layer.

In some arrangements of the present disclosure, an energy level of a material of the second hole transport layer matches an energy level of a material of the first hole transport layer.

In some arrangements of the present disclosure, the energy level of the material of the second hole transport layer is between the energy level of the material of the first hole transport layer and an energy level of a material of the quantum dot light emitting layer.

A material of the second hole transport layer is the same as a material of the first hole transport layer.

In some arrangements of the present disclosure, the quantum dot light emitting device further includes a hole injection layer interposed between the first hole transport layer and the first electrode, and an electron transport layer interposed between the quantum dot light emitting layer and the second electrode.

In some arrangements of the present disclosure, the filling layer has a thickness of less than 5 nm.

In some arrangements of the present disclosure, the electron transport layer includes a transport layer film composed of nanoparticles. The nanoparticles include titanium dioxide nanoparticles, zinc oxide nanoparticles, magnesium doped zinc oxide nanoparticles, or aluminum doped zinc oxide nanoparticles.

According to an aspect of the present disclosure, there is provided a quantum dot light emitting diode display device comprising the above quantum dot light emitting device arranged in an array.

According to an aspect of the present disclosure, there is provided a method of manufacturing a quantum dot light emitting device. The method includes forming a first electrode and a quantum dot light emitting layer sequentially over a substrate. The method includes forming a filling layer over the quantum dot light emitting layer to embed the filling layer into the quantum dot light emitting layer.

The method includes forming a second electrode over the filling layer.

In some arrangements of the present disclosure, the filling layer has a first surface adjacent to the first electrode and a second surface adjacent to the second electrode, and the quantum dot light emitting layer is interposed between the first surface and the second surface. The distance between the quantum dot light emitting layer and the first surface is less than a distance of the quantum dot light emitting layer from the second surface.

In some arrangements of the present disclosure, the method further includes forming a hole injection layer and a first hole transport layer sequentially over the first electrode before the formation of the quantum dot light emitting layer. The method further includes forming an electron transport layer over the filling layer before the formation of the second electrode.

In some arrangements of the present disclosure, the forming the second hole transport layer over the quantum dot light emitting layer includes forming a second hole transport layer having a thickness of less than 5 nm over the quantum dot light emitting layer by a spin coating process.

In some arrangements of the present disclosure, an energy level of a material of the second hole transport layer matches an energy level of a material of the first hole transport layer.

In some arrangements of the present disclosure, the energy level of the material of the second hole transport layer is between the energy level of the material of the first hole transport layer and an energy level of a material of the quantum dot light emitting layer.

In some arrangements of the present disclosure, a material of the second hole transport layer is the same as a material of the first hole transport layer.

It is to be understood that both the foregoing general description and the following detailed description are exemplary and explanatory only and are not restrictive of the disclosure.

BRIEF DESCRIPTION OF THE DRAWINGS

The accompanying drawings, which herein are incorporated in and constitute a part of this specification, illustrate arrangements consistent with the present disclosure, and serve to explain the principles of the disclosure together with the specification. Obviously, the drawings in the following description are merely some of the arrangements of the present disclosure. Those skilled in the art can also obtain other drawings based on these drawings without any creative work.

DETAILED DESCRIPTION

Figure 1:
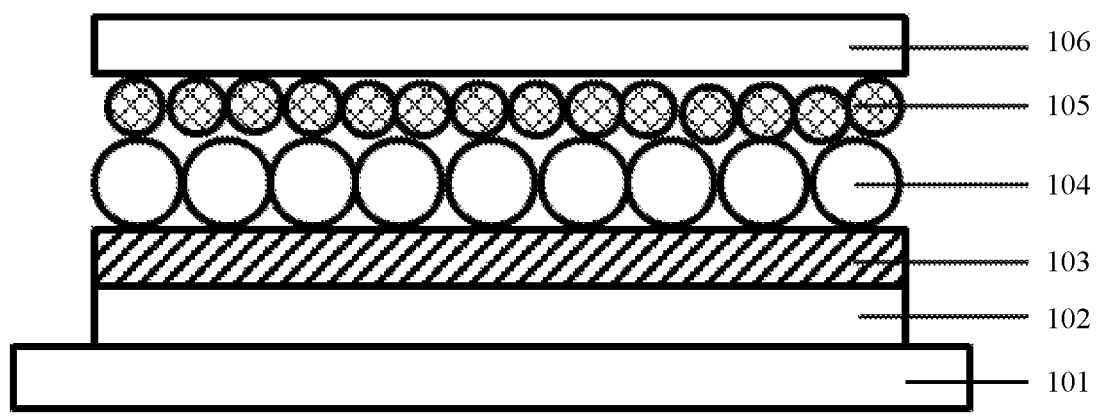
FIG. 1 schematically shows a structural schematic diagram of a quantum dot light emitting device according to a comparative example.

Exemplary arrangements will now be described more fully with reference to the accompanying drawings. However, the exemplary arrangements can be implemented in various ways and should not be construed as limited to the examples set forth herein. Rather, these arrangements are provided to render the present disclosure to be more full and complete, and fully convey the concept of the exemplary arrangements to those skilled in the art. The described features, structures, or characteristics may be combined in any suitable manner in one or more arrangements.

Moreover, the drawings are merely schematic illustration of the present disclosure and are not necessarily drawn to scale. The same reference numerals in the drawings denote the same or similar parts, and their repeated description will be omitted.

FIG. 1 shows a structural schematic diagram of a quantum dot light emitting device according to a comparative example. As can be seen from the drawing, the quantum dot light emitting device may include an anode 101, a hole injection layer 102, a hole transport layer 103, a quantum dot light emitting layer 104, a nano-ZnO electron transport layer 105, and a cathode 106. The quantum dot light emitting layer 104 and the nano-ZnO electron transport layer 105 are both film formed by using nanoparticles. Considering the poor film formation of nanoparticles, pinholes are inevitably generated, and QLED devices containing multilayer nanoparticle films are prone to electric leakage, and thus the variation causes current density to be large, thus the efficiency and service life of QLED devices may be affected.

Due to the poor film formation of nanoparticles, pinholes are inevitably generated in the nanoparticle film, and the QLED device containing the multilayer nanoparticle film is prone to electric leakage due to the presence of the pinholes, resulting in a large current density, which is about an order of magnitude higher than organic light emitting diodes (OLED), which affects the efficiency and life of QLED devices.

Based on this, related documents have reported a method of the use of hole transport materials and quantum dot materials to blend and coating to improve film formation properties, but this method will lead to problems such as more serious phase separation and quantum dot aggregation, and also need to carefully mix the ratio of quantum dots to different hole transport materials, of which the operation process is complicated.

Figure 2:
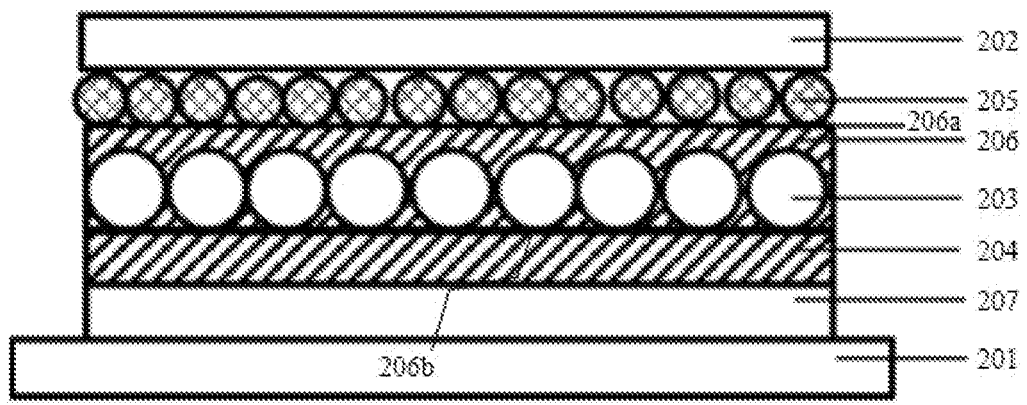
FIG. 2 schematically shows a structural schematic diagram of a quantum dot light emitting device in some arrangements of the present disclosure.

The present exemplary arrangement provides a quantum dot light emitting device. As shown in FIG. 2, the quantum dot light emitting device 20 may include: a first electrode 201 and a second electrode 202 disposed opposite to each other, a quantum dot light emitting layer 203 located between the first electrode 201 and the second electrode 202, a first hole transport layer 204 located between the quantum dot light emitting layer 203 and the first electrode 201, a hole injection layer 207 located between the first hole transport layer 204 and the first electrode 201, an electron transport layer 205 located between the quantum dot light emitting layer 203 and the second electrode 202, and a filling layer 206 located between the quantum dot light emitting layer 203 and the electron transport layer 205 and embedded in the quantum dot light emitting layer 203.

The quantum dot light emitting layer 203 may include a quantum dot layer film composed of a quantum dot material, and pinholes are inevitably generated in the quantum dot layer film. The filling layer 206 may be used to fill the generated pinholes in the quantum dot light emitting layer 203. For example, when the filling layer 206 is manufactured by a spin coating process, the planarization effect can be achieved based on the fluidity of the filling layer material solution.

In the quantum dot light emitting device provided by the exemplary arrangement of the present disclosure, the filling layer 206 embedded in the quantum dot light emitting layer is additionally added between the quantum dot light emitting layer 203 and the electron transport layer 205 to realize the filling of the pinholes generated in the quantum dot light emitting layer 203 during the formation of the filling layer 206, so that the leakage can be effectively prevented, thus achieving the effect of reducing the current density.

In the present exemplary arrangement, the filling layer 206 may include a second hole transport layer, that is, a filling layer formed using a hole transport material.

Based on this, the second hole transport layer may be coated around the quantum dot light emitting layer 203 together with the first hole transport layer 204 to increase the contact area between the quantum dot material and the hole transport material, thus improving the injection efficiency of the hole. Meanwhile, as shown in FIG. 2, the filling layer (the second hole transport layer) 206 has a first surface 206a adjacent to the first electrode 201 and a second surface 206b adjacent to the second electrode 202, the quantum dot light emitting layer is located between the first surface 206a and the second surface 206b, and the distance between the quantum dot light emitting layer and the first surface 206a is less than the distance between the quantum dot light layer and the second surface 206b. In one arrangement, the distance between the quantum dot light emitting layer and the first surface may be zero (i.e., at least a portion of the quantum dot light emitting layer is in contact with the first surface). Since the hole transport material has a high LUMO value, which has a certain electron blocking effect, and thus can balance the hole/electron injection.

In addition, a part of the hole/electron pair is recombined at the interface of the second hole transport layer and the electron transport layer 205, and the partial energy can be transferred to the quantum dot light emitting layer 203 by fluorescence resonance energy transfer (FRET), thus not affecting the efficiency of QLED devices. Fluorescence resonance energy transfer means that in two different fluorophores, if the emission spectrum of one fluorophore (donor) overlaps with the absorption spectrum of another group (acceptor), when the distance between the two fluorescent groups is appropriate (generally less than 100 Å), the phenomenon that the fluorescence energy is transferred from the donor to the acceptor can be observed. In this way, the quantum dot light emitting device can improve the efficiency of the QLED device from the aspects of reducing current density and balancing the hole/electron injection, and the implementation of the quantum dot light emitting device is simple and has a high operability, and other problems such as phase separation or quantum dot aggregation are not introduced.

Optionally, the second hole transport layer 206 and the first hole transport layer 204 may be made of materials with matched energy levels or the same material, for example, materials that can be used as a hole transport material, such as PVK (Polyethylene carbazole), Poly-TPD (poly[N,N'-bis(4-butylphenyl)-N,N'-bis(phenyl)benzidine]) and TFB (Poly[(9,9-dioctylfluorenyl-2,7-diyl)-co-(4,4'-(N-(4-butylphenyl)diphenylamine)]), or the like, thus forming a structure in which a hole transport material coats a quantum dot light emitting material, thus contributing to an improvement in hole injection efficiency. The energy level matching of the material of the second hole transport layer 206 and the material of the first hole transport layer 204 means that the energy level (HOMO) of the second hole transport layer material is between the HOMO levels of the first hole transport layer and the quantum dot. As such, it is advantageous for hole injection into the quantum dots. For example, the first hole transport layer material is TFB, and the second hole transport layer material is PVK. Alternatively, the second hole transport layer material may be the same as the first hole transport layer material; the use of the planarization layer may increase the contact area of the hole transport layer with the quantum dots, and increase the hole injection, as compared with the case where the planarization layer is not used.

On the basis of this, the second hole transport layer 206 and the first hole transport layer 204 may also be made of the same material, for example, a toluene solution of PVK (Polyethylene carbazole), so that the preparation of the two film layers can be achieved by arranging the same material only, thus the process can be simplified.

In this exemplary arrangement, the filling layer 206 may have a thickness of less than 5 nm. It should be noted that the thickness herein refers to the thickness of the filling layer 206 after filling the pinholes in the quantum dot light emitting layer 203. The thickness of the filling layer 206 can be controlled, for example, by adjusting the concentration of the filling layer material and the spin coating speed. Based on this, the filling layer 206 can play a role of planarization while filling the pinholes, thus facilitating the preparation of the subsequent film layers.

In this exemplary arrangement, the electron transport layer 205 may include a transport layer film composed of nanoparticles. The nanoparticles may be one or more of titanium dioxide ($TiO_2$) nanoparticles or zinc oxide (ZnO) nanoparticles, magnesium-doped zinc oxide nanoparticles, and the aluminum-doped zinc oxide nanoparticles. The electron transport layer 205 may be, for example, an ethanol solution of ZnO nanoparticles, and the particle diameter of the ZnO nanoparticles is not more than 5 nm. Since both the electron transport layer 205 and the quantum dot light emitting layer 203 are formed of nanoparticles, of which the film formation is poor, and the pinholes are easily generated. In this arrangement, the second hole transport layer 206 formed by the hole transport material is added between the two, thus the pinholes in the quantum dot light emitting layer 203 can be filled to achieve the planarization effect.

In the exemplary arrangement, the hole injection layer 207 may be, for example, a PEDOT:PSS (poly(3,4-ethylenedioxythiophene)-poly(styrenesulfonate)) film, and the setting of the hole injection layer 207 facilitates to further improve the hole injection effect.

It should be understood that the various functional layers in the present arrangement, such as a hole injection layer, a hole transport layer, an electron injection layer, and the like, may be optional structures. In other words, the present arrangement may be implemented in the case of omitting one or more of these functional layers, or may further include one or more other functional layers, for example, an electron injection layer that may be disposed between the cathode and the electron transport layer, and the like.

Figure 4:
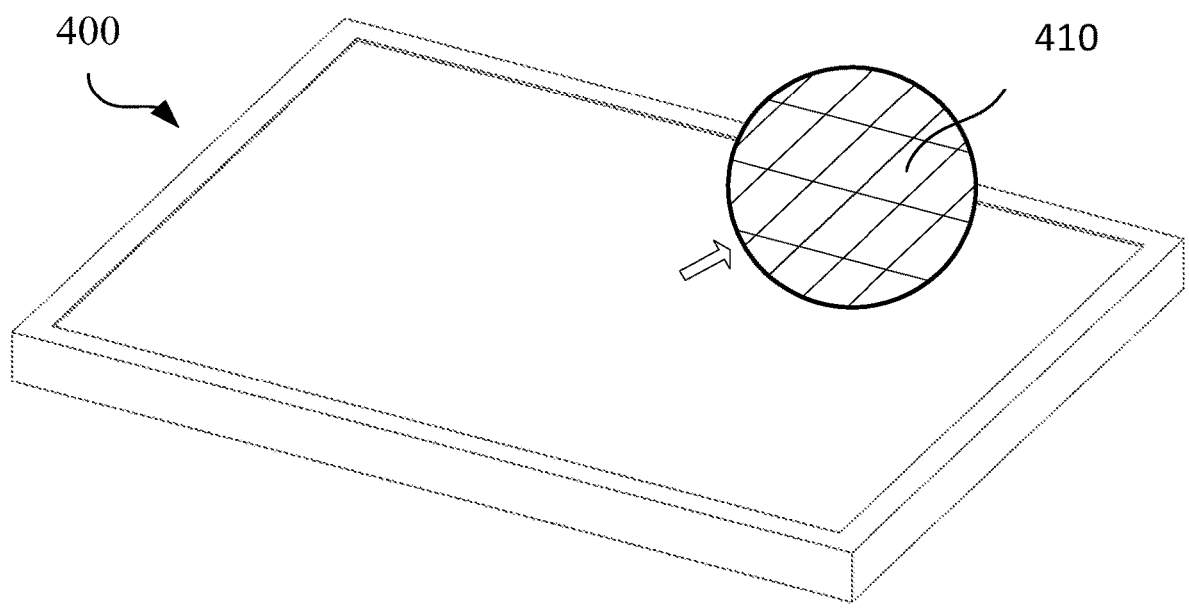
FIG. 4 schematically shows a quantum dot light emitting display device in some arrangements of the present disclosure.

The present exemplary arrangement further provides a QLED display device. The display device in the arrangements of the present disclosure may be any product or component having a display function such as a display panel, a mobile phone, a tablet, a television, a display, a notebook computer, a digital photo frame, a navigator and the like. As an example, FIG. 4 schematically shows a quantum dot light emitting display device in some arrangements of the present disclosure. The QLED display device 400 comprising a plurality of quantum dot light emitting devices 410, as described above, that are arranged as an array. The first electrode 201 or the second electrode 202 of the plurality of quantum dot light emitting devices 410 may be an integrated structure.

In this way, the QLED display device can not only has an improved external quantum efficiency, but also has an improved hole injection efficiency to balance the hole/electron injection effect, and the implementation scheme is simple, has a high operability, and other problems such as phase separation or quantum dot aggregation are not introduced.

Figure 3:
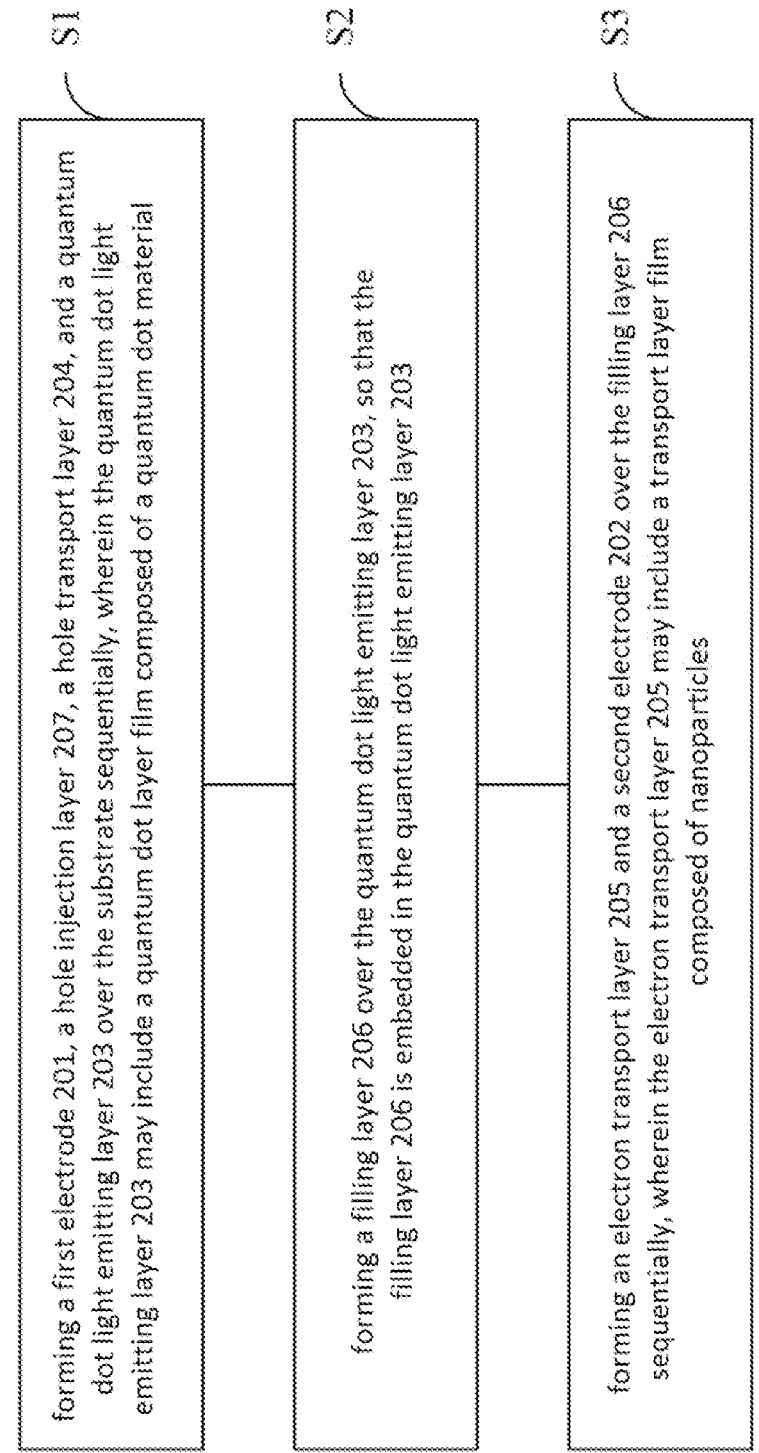
FIG. 3 schematically shows a flow chart of a method of manufacturing a quantum dot light emitting device in some arrangements of the present disclosure.

The exemplary arrangement further provides a method of manufacturing a quantum dot light emitting device. As shown in FIG. 3, the manufacturing method may include the following:

S1, forming a first electrode 201, a hole injection layer 207, a first hole transport layer 204, and a quantum dot light emitting layer 203 over the substrate sequentially. The quantum dot light emitting layer 203 may include a quantum dot layer film composed of a quantum dot material;

S2, forming a filling layer 206 over the quantum dot light emitting layer 203, so that the filling layer 206 is embedded in the quantum dot light emitting layer 203;

S3, forming an electron transport layer 205 and a second electrode 202 over the filling layer 206 sequentially. The electron transport layer 205 may include a transport layer film composed of nanoparticles.

In a method of manufacturing a quantum dot light emitting device provided by some arrangements of the present disclosure, the filling layer 206 embedded in the quantum dot light emitting layer 203 is additionally added between the quantum dot light emitting layer 203 and the electron transport layer 205 to realize the filling of the pinholes generated in the quantum dot light emitting layer 203 during the formation of the filling layer 206, so that the leakage can be effectively prevented, thus achieving the effect of reducing the current density.

In the present exemplary arrangement, the forming the filling layer 206 over the quantum dot light emitting layer 203 may include forming a second hole transport layer having a thickness of less than 5 nm over the quantum dot light emitting layer 203 by a spin coating process. Here, the thickness refers to the thickness of the filling layer 206 after filling the pinholes in the quantum dot light emitting layer 203, which can be controlled, for example, by adjusting the concentration of the first hole transport layer material and the spin coating speed.

Based on this, the second hole transport layer may be coated around the quantum dot light emitting layer 203 together with the first hole transport layer 204 to increase the contact area between the quantum dot material and the hole transport material, thus improving the injection efficiency of the hole, while the hole transport material has a high LUMO value, which has a certain electron blocking effect, and thus can balance the hole/electron injection. In addition, a portion of the hole/electron pair will recombine at the interface of the second hole transport layer and the electron transport layer 205, and this partial energy can be transferred to the quantum dot light emitting layer 203 by FRET, thus not affecting the efficiency of the QLED device. Based on this, the quantum dot light emitting device can improve the efficiency of the QLED device from the aspects of reducing current density and balancing the hole/electron injection, and the implementation of the quantum dot light emitting device is simple and has a high operability, and other problems such as phase separation or quantum dot aggregation are not introduced.

Optionally, the second hole transport layer 206 and the first hole transport layer 204 may be made of materials with matched energy levels or the same material, for example, materials that can be used as a hole transport material, thus forming a structure in which a hole transport material coats a quantum dot light emitting material, thus contributing to an improvement in hole injection efficiency.

On the basis of this, the second hole transport layer 206 and the first hole transport layer 204 may also be made of the same material, for example, a toluene solution of PVK (Polyethylene carbazole), so that the preparation of the two film layers can be achieved by arranging the same material only, thus the process can be simplified.

In this exemplary arrangement, the electron transport layer 205 may include a transport layer film composed of nanoparticles. The nanoparticles may be $TiO_2$ nanoparticles or ZnO nanoparticles, and the electron transport layer 205 may be, for example, an ethanol solution of ZnO nanoparticles, and the ZnO nanoparticles have a particle diameter of not more than 5 nm.

In the exemplary arrangement, the hole injection layer 207 may be, for example, a PEDOT:PSS (poly(3,4-ethylenedioxythiophene)-poly(styrenesulfonate)) film, and the formation of the hole injection layer 207 facilitates to further enhance the hole injection effect.

The method of manufacturing the quantum dot light emitting device will be described in detail below with reference to a specific arrangement. For example, the method of manufacturing the quantum dot light emitting device may include:

S101, forming a first electrode 201 such as an ITO electrode on a substrate by a deposition method, and then performing ultrasonic cleaning on the substrate on which the ITO electrode is formed by using deionized water and isopropyl alcohol for 15 minutes, respectively, and then rapidly dried with a nitrogen gun, and then baked on a hot plate at 150° C. for 5 minutes, then performing UV-ozone (ultraviolet-ozone) treatment for half an hour to clean the ITO surface and improve the ITO work function.

S102, spin coating PEDOT:PSS on the surface of the cleaned ITO electrode at 3000 rpm in an air environment, with spin coating time of 1 minute, and then annealing the spin-coated substrate in air at a temperature of 130° C. for 20 minutes to dry the solvent which is not completely volatilized, resulting in the hole injection layer 207.

S103, spin coating a PVK toluene solution (30 mg/mL) on the PEDOT:PSS film layer at 2500 rpm in an argon glove box, with the spin coating time of 45 seconds, and then annealing the spin-coated substrate in the glove box at a temperature of 120° C. for 20 minutes, resulting in the first hole transport layer 204.

S104, spin coating a hexane solution of a red CdSe/ZnS quantum dot (concentration: 30 mg/mL) on the PVK film at 3000 rpm, with the spin coating time of 45 seconds, and then annealing the spin-coated substrate in the glove box at a temperature of 130° C. for 30 minutes, resulting in the quantum dot light emitting layer 203 corresponding to a red sub-pixel. It should be noted that the method of forming the quantum dot light emitting layer 203 corresponding to other sub-pixels such as the green sub-pixel and the blue sub-pixel is similar to that, and details are not described herein again.

S105, spin coating a PVK toluene solution (10 mg/mL) on the quantum dot light emitting layer 203 at 5000 rpm, and controlling the thickness of the layer after filling the pinholes in the quantum dot light emitting layer 203 to less than 5 nm, and then annealing the spin-coated substrate in the glove box at a temperature of 120° C. for 20 minutes, resulting in the second hole transport layer 206.

S106, spin coating an ethanol solution of ZnO nanoparticles (30 mg/mL) on the PVK film at 1500 rpm, with the spin coating time of 45 seconds. The particle diameter of the ZnO nanoparticles is not more than 5 nm, resulting in the electron transport layer 205.

S107, forming a second electrode 202 having a thickness of 200 nm, for example, an aluminum cathode, on the electron transport layer 205 by vapor deposition, resulting in the quantum dot light emitting device of the present arrangement.

In a quantum dot light emitting device and a method of manufacturing the same, and a QLED display device provided by some arrangements of the present disclosure, the filling layer embedded in the light emitting layer is additionally added between the light emitting layer and the electron transport layer to realize the filling of the pinholes generated in the nanoparticles films during the formation of the filling layer due to the fluidity of the filling layer material solution, so that the leakage can be effectively prevented, thus achieving the effect of reducing the current density.

It should be noted that the arrangement is only some arrangements of the present disclosure, but the present disclosure may also adopt other alternative to manufacture the quantum dot light emitting device, which is not specifically limited herein.

It should be noted that although several modules or units of equipment for action execution are mentioned in the detailed description above, such division is not mandatory. In fact, features and functions of two or more of the modules or units described above may be embodied in one module or unit in accordance with the arrangements of the present disclosure. Conversely, the features and functions of one of the modules or units described above may be further divided into multiple modules or units to be embodied.

In addition, although the various blocks of the method of the present disclosure are described in a particular order in the drawings, this is not required or implied that the blocks must be performed in the specific order, or all the blocks shown must be performed to achieve the desired result. Additionally or alternatively, certain blocks may be omitted, multiple blocks may be combined into one block to execute, and/or one block may be divided into multiple blocks to execute, and the like.

By considering the specification and practicing solutions disclosed herein, those skilled in the art will readily envisage other arrangements of the present disclosure. This application is intended to cover any variations, uses, or adaptations of the present disclosure which follow the general principles of the present disclosure and comprise any common knowledge or conventional techniques in this technical field that are not disclosed in the present disclosure. The description and examples are to be considered exemplary only, and the true scope and spirit of the disclosure are indicated by the appended claims.

It should be understood that the present disclosure is not limited to the precise structure that has been described above and shown in the drawings, and may have various modifications and changes without departing from the scope thereof. The scope of the present disclosure is defined only by the appended claims.

What is claimed is:

1. A quantum dot light emitting device comprising:
a first electrode and a second electrode;
a quantum dot light emitting layer interposed between the first electrode and the second electrode; and
a filling layer located on the quantum dot light emitting layer and embedded in the quantum dot light emitting layer,
wherein the filling layer has a thickness less than 5 nanometers (nm).

2. The quantum dot light emitting device according to claim 1, wherein the filling layer has a first surface adjacent to the first electrode and a second surface adjacent to the second electrode, the quantum dot light emitting layer is interposed between the first surface and the second surface, and a first distance between the quantum dot light emitting layer and the first surface is less than a second distance between the quantum dot light emitting layer and the second surface.

3. The quantum dot light emitting device of claim 2, wherein the quantum dot light emitting layer is in contact with the first surface.

4. The quantum dot light emitting device of claim 2, wherein the first electrode is an anode and the second electrode is a cathode.

5. The quantum dot light emitting device of claim 4, further comprising:
a first hole transport layer interposed between the quantum dot light emitting layer and the first electrode.

6. The quantum dot light emitting device of claim 5, wherein the filling layer comprises a second hole transport layer.

7. The quantum dot light emitting device of claim 6, wherein an energy level of a material of the second hole transport layer matches an energy level of a material of the first hole transport layer.

8. The quantum dot light emitting device of claim 7, wherein the energy level of the material of the second hole transport layer is between the energy level of the material of the first hole transport layer and an energy level of a material of the quantum dot light emitting layer.

9. The quantum dot light emitting device of claim 6, wherein a material of the second hole transport layer is the same as a material of the first hole transport layer.

10. The quantum dot light emitting device of claim 9, further comprising:
a hole injection layer interposed between the first hole transport layer and the first electrode; and
an electron transport layer interposed between the quantum dot light emitting layer and the second electrode.

11. The quantum dot light emitting device of claim 10, wherein the electron transport layer comprises one or more of titanium dioxide nanoparticles, zinc oxide nanoparticles, magnesium doped zinc oxide nanoparticles, and aluminum doped zinc oxide nanoparticles.

12. A quantum dot light emitting display device comprising the quantum dot light emitting device of claim 1 arranged in an array.

13. A method of manufacturing a quantum dot light emitting device, comprising:
forming a first electrode and a quantum dot light emitting layer sequentially over a substrate;
forming a filling layer over the quantum dot light emitting layer to embed the filling layer into the quantum dot light emitting layer;
forming a second electrode over the filling layer,
wherein the filling layer has a thickness less than 5 manometers (nm).

14. The method of claim 13, wherein the filling layer has a first surface adjacent to the first electrode and a second surface adjacent to the second electrode, the quantum dot light emitting layer is interposed between the first surface and the second surface, and a first distance between the quantum dot light emitting layer and the first surface is less than a second distance between the quantum dot light emitting layer and the second surface.

15. The method of claim 13, further comprising:
forming a hole injection layer and a first hole transport layer sequentially over the first electrode before the formation of the quantum dot light emitting layer; and
forming an electron transport layer over the filling layer before forming the second electrode.

16. The method of claim 13, wherein the forming the filling layer over the quantum dot light emitting layer comprises:
forming a second hole transport layer having a thickness of less than 5 nm over the quantum dot light emitting layer by a spin coating process.

17. The method of claim 16, wherein an energy level of a material of the second hole transport layer matches an energy level of a material of the first hole transport layer.

18. The method of claim 17, wherein the energy level of the material of the second hole transport layer is between the energy level of the material of the first hole transport layer and an energy level of a material of the quantum dot light emitting layer.

19. The method of claim 16, wherein a material of the second hole transport layer is the same as a material of the first hole transport layer.

* * * * *